United States Patent [19]

Cuppens et al.

[11] Patent Number: 4,707,807
[45] Date of Patent: Nov. 17, 1987

[54] NON-VOLATILE, PROGRAMMABLE, STATIC MEMORY CELL

[75] Inventors: Roger Cuppens; Cornelis D. Hartgring, both of Eindhoven, Netherlands

[73] Assignee: U.S. Philips Corporation, New York, N.Y.

[21] Appl. No.: 806,313

[22] Filed: Dec. 9, 1985

[30] Foreign Application Priority Data

Jun. 6, 1985 [NL] Netherlands .......................... 8501631

[51] Int. Cl.⁴ ............................................. G11C 11/00
[52] U.S. Cl. .................................... 365/154; 365/185; 365/228
[58] Field of Search ............... 365/184, 185, 154, 156, 365/95, 104, 228

[56] References Cited

U.S. PATENT DOCUMENTS

| | | | |
|---|---|---|---|
| 4,128,773 | 12/1978 | Troutman et al. | 365/185 |
| 4,342,101 | 7/1982 | Edwards | 365/154 |
| 4,388,704 | 6/1983 | Bertin et al. | 365/185 |
| 4,420,821 | 12/1983 | Hoffman | 365/185 |

OTHER PUBLICATIONS

Klein et al., "5v Only Nonvolatile RAM Owes It All To Polysilicon", Electronics, Oct. 11, 1979, pp. 111-116.

Primary Examiner—Stuart N. Hecker
Assistant Examiner—Glenn A. Gossage
Attorney, Agent, or Firm—Robert T. Mayer

[57] ABSTRACT

A memory and a non-volatile, programmable, static memory cell in which a programmable transistor and a capacitance are added to a known static memory cell. The cross-wise couplings between the transistors of the static cell form a first and a second junction. The gate and a main electrode (drain) of the programmable transistor are connected to the first junction. The second junction is connected to an injection location opposite the floating gate of the programmable transistor whose channel is connected in series with the capacitance the other side of which is connected to the sources of the two transistors of the static cell.

5 Claims, 2 Drawing Figures

NON-VOLATILE, PROGRAMMABLE, STATIC MEMORY CELL

The invention relates to a non-volatile, programmable, static memory cell which includes a first and a second insulated gate transistor, the gate of each transistor being connected to a main electrode (drain) of the other transistor, each of said main electrodes being connected, by way of a load, to a first supply terminal, further main electrodes (sources) of the first and the second transistor being connected to each other and to a second supply terminal, between the gate of the first transistor and the second supply terminal there being connected a series connected of a capacitance and a channel of a programmable transistor which includes an insulated gate and a floating electrode which is situated between the gate and the channel. The invention also relates to a non-volatile, programmable, static memory.

Memories comprising non-volatile, programmable static memory cells approximate the ideal memory; the contents can be read and programmed as in a known static memory (RAM) and the data stored therein is sustained even without the memory being connected to a supply source. A memory cell available for such a memory is known from "Digest of Technical Papers", ISSCC, Feb. 19, 1981, pages 148–149. A conventional static memory cell includes a section to be programmed (in dependence on the data in the cell) which includes an EEPROM transistor and an additional capacitance. The presence or absence of said capacitance determines the state assumed by the flip-flop (=static memory cell). It is a drawback of the described memory cell that the control of the transistor to be programmed is highly complex; this results in a comparatively large cell area and hence a comparatively low integration density. It is a further drawback of the described memory cell that the gate of the programmable transistor has a floating potential. Consequently, the programming of this transistor is a dynamic operation, so that it is susceptible to alpha radiation, injection of minority charge carriers and the like. This is because the charge on the gate will leak away in the course of time (during programming). The period of time required for this purpose is in the same order of magnitude as the "refresh" time of dynamic memories (same ms at 100° C.). It is a major drawback of the described memory cell that it includes an additional input for programming, so that a memory comprising such memory cells requires an additional control line per row of memory cells.

It is the object of the invention to provide a non-volatile, programmable, static memory cell which involves simpler control of the programmable transistor, which requires only a comparatively small area, and in which the programming voltages to be applied to the relevant transistor are determined statically instead of dynamically.

To achieve this, a memory cell of the kind set forth is characterized in that the gate and a main electrode of the programmable transistor are connected to the gate of the first transistor, the gate of the second transistor being connected to a charge injection location opposite the floating electrode.

Embodiments of the invention will be described in detail hereinafter, by way of example, with reference to the drawing; therein;

Figure 1:
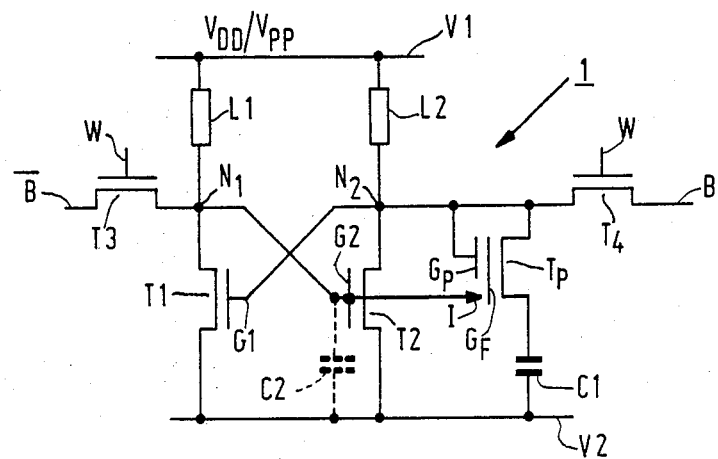
FIG. 1 shows a first memory cell in accordance with the invention.

FIG. 1 shows a memory cell 1 in accordance with the invention which includes a conventional static memory cell comprising two cross-wise coupled transistors T1, T2 and two loads L1, L2. The loads L1, L2 can be constructed in known manner as transistors whose gate is connected to a main electrode (source). The loads L1, L2 connect two nodes N1, N2 to a first supply terminal V1 which normally carries the supply voltage $V_{DD}$ which can be increased (as soon as necessary for programming) to the programming voltage $V_{PP}$. Further main electrodes (sources) of the transistors T1, T2 are connected to a second supply terminal V2 (ground). As is usual, to each node N1, N2 there is connected a transistor T3, T4 which connects the node N1, N2 to a bit line $\bar{B}$, B when a control signal W is applied to the transistors T3, T4 in order to read the contents of, or for placing new contents in, the static flip-flop T1, T2, L1, L2.

In accordance with the invention, a series connection of a channel of a programmable transistor Tp and a capacitance C1 is connected between the node N2 (connected to the gate G1 of the first transistor T1) and the second supply terminal V2. The gate Gp and a main electrode (drain) of the programmable transistor Tp are connected to the node N2. Furthermore, a charge injection location I opposite the floating electrode $G_F$ of the transistor Tp is connected to the node N1 (and hence also to the gate G2 of the transistor T2). The injection location I can be provided "above" or "below" the floating electrode GF (viewed from the substrate), the distance between the charge injection location I and the electrode $G_F$ being, for example from 50 to 200 Å.

The operation of the memory cell 1 is as follows. When a supply voltage $V_{DD}=5$ V is present on the supply terminal V1, the memory cell 1 behaves as a conventional static memory cell. For permanently retaining the data contained in the cell 1, the voltage on the supply terminal V1 is increased to a programming voltage Vpp (Vpp=+15 V). When a logic "1" is present in the static memory cell (T1 is turned on, T2 is turned off), the potential at the node N2 will increase from $V_{DD}$ (=5 V) to Vpp=15 V. The potential at the node N1 is and remains 0 V. Consequently, the gate Gp carries a high potential so that the floating electrode $G_F$ is negatively charged because of electron injection from the injection location I to the floating electrode GF. The transistor Tp will be turned off and will uncouple the capacitance C1 from the node N2.

If a logic "0" is present in the static memory cell (T1 is turned off, T2 is turned on), the voltage at the node N2 will be and will remain low when the voltage at the supply terminal V1 is increased to the programming voltage Vpp, whilst at the node N1 the voltage will increase from $V_{DD}$ to the programming voltage Vpp. The gate $G_p$ is thus at a low potential (0 V), whilst the injection location I carries the programming voltage. Consequently, electrons will dissipate from the floating electrode $G_F$ (to the injection location I) and a net positive charge will remain on the floating electrode. The transistor Tp is thus turned on, so that the capacitance C1 is connected to the node N2.

Both described states of the transistor Tp are maintained after the supply voltage $V_{DD}$ for the memory cell 1 has been switched off. When the supply voltage $V_{DD}$ is switched on (the voltage on the terminal V1 increases from 0 to 5 V), the transistor Tp determines which of the two transistors T1, T2 will be turned on. When the transistor Tp is turned on, the capacitance C1 is connected to the node N2 so that the latter will be charged more slowly than the node N1. Consequently, the transistor T2 will be turned on faster, so that ultimately the transistor T1 will be turned off and the transistor T2 will be turned on. Thus, a logic "0" is again written in the static memory. When the transistor Tp is turned off, in which state the capacitor C1 is uncoupled from the node N2, the node N2 must be charged more quickly than the node N1. This will take place when the R-C time constant of capacitance formed at the node N1 of the main electrode of the first transistor T1 and the gate G2 of the second transistor T2 and the load (L1) connected thereto is larger than the R-C time constant of capacitance formed at the second node N2 of the main electrode of the second transistor T2 and the gate of the first transistor T1, the load (L2) connected thereto and the series connection of the programmable transistor Tp and the capacitance C1 connected thereto when the programmable transistor is turned off and is smaller than the last-mentioned R-C time constant when the programmable transistor is turned on. The transistor T1 will then be turned on and the transistor T2 will be turned off, which means that a logic "1" is written in the static cell. When the two loads L1 and L2 are equal, the required condition can be satisfied by providing the node N1 with a small capacitance C2.

Figure 2:
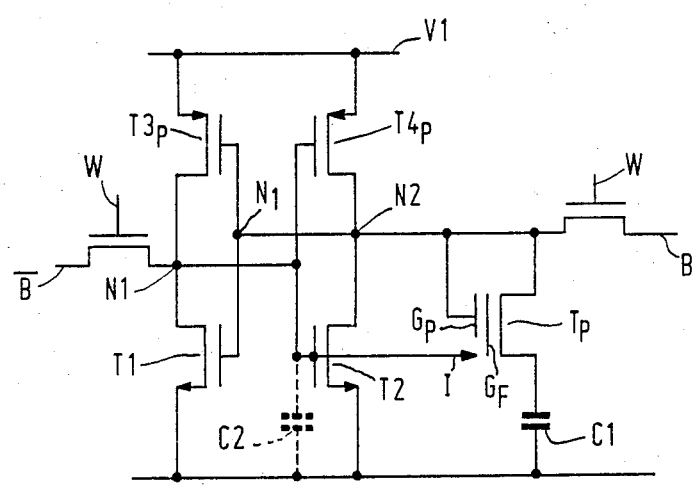
FIG. 2 shows a second and preferred memory cell in accordance with the invention.

The current flowing through the memory cell 1 during programming can be restricted to a few nanoamperes by constructing the loads L1, L2 as high-ohmic polyresistors. The current can be further reduced (to sub-picoamperes) by making use of PMOS transistors T3p T4p (see FIG. 2) instead of the loads L1, L2 (the transistors T1, T2, Tp are NMOS transistors), so that a non-volatile, programmable, static CMOS memory can be obtained.

The control and the use of a non-volatile, programmable, static memory in accordance with the invention are in principle in same as for a volatile static memory. The programming merely requires a known circuit capable of supplying the supply voltage $V_{DD}$ as well as the programming voltage Vpp to the supply terminal V1.

What is claimed is:

1. A non-volatile programmable static memory cell including first and second insulated gate transistors each with a source, a drain and a gate, the gate of each transistor being connected to the drain of the other, a first supply terminal, a separate load connected between each drain and said first supply terminal, a second supply terminal, the sources of said first and second transistors being connected to said second supply terminal, a capacitor and a programmable transistor with a channel, said capacitance and said channel being connected in series between the gate of said first transistor and said second supply terminal, said programmable transistor including a source, a drain, a control gate, a floating electrode and a charge injection location opposite said floating electrode, said control gate and said drain of said programmable transistor being connected to the gate of said first transistor, said charge injection location being connected to the gate of said second transistor.

2. The memory cell as claimed in claim 1, wherein said programmable transistor can be programmed by applying a programming voltage to said first supply terminal whereby said programmable transistor can be switched from an off condition to an on condition.

3. A memory cell as claimed in claim 2, wherein each load comprises a PMOS transistor.

4. A memory cell as claimed in claim 2 or 3, wherein a first and second node are formed by the connection of the drains of the first and second transistors to the gates of the second and the first transistors, respectively, each node having an associated R-C time constant, the R-C time constant of said first node being larger than that of said second node when said programmable transistor is in said off condition and said R-C time constant of said first node being smaller than that of said second node when said programmable transistor is in said on condition.

5. A memory cell as claimed in claim 4, wherein a capacitance is connected between the gate of said second transistor and said second supply terminal.

* * * * *